(12) United States Patent
Yang et al.

(10) Patent No.: US 9,775,267 B2
(45) Date of Patent: Sep. 26, 2017

(54) STRUCTURE AND METHOD FOR REDUCING ELECTROMAGNETIC INTERFERENCE

(71) Applicant: GIGA-BYTE TECHNOLOGY CO., LTD., New Taipei (TW)

(72) Inventors: Min-Yuan Yang, New Taipei (TW); Chien-Hsiang Huang, New Taipei (TW); Hsin-Hong Wu, New Taipei (TW); Lien-Cheng Tsai, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/213,414

(22) Filed: Jul. 19, 2016

(65) Prior Publication Data

US 2017/0034962 A1 Feb. 2, 2017

(30) Foreign Application Priority Data

Jul. 30, 2015 (TW) .............................. 104124686 A

(51) Int. Cl.
*H05K 9/00* (2006.01)
*G06F 1/18* (2006.01)
(Continued)

(52) U.S. Cl.
CPC ........... *H05K 9/0024* (2013.01); *G06F 1/185* (2013.01); *H05K 1/0216* (2013.01); *H05K 1/18* (2013.01);
(Continued)

(58) Field of Classification Search
CPC ............... H05K 9/0064; H05K 1/0231; H05K 2201/1031
See application file for complete search history.

(56) References Cited

U.S. PATENT DOCUMENTS 5,035,631 A    7/1991  Piorunneck et al.
5,478,260 A *  12/1995 Kaufman ............. G06K 7/0047
                                           439/108

(Continued)

FOREIGN PATENT DOCUMENTS

CN    201515096     6/2010
JP    2005277197    10/2005
(Continued)

OTHER PUBLICATIONS

"Search Report of European Counterpart Application," dated Dec. 13, 2016, p. 1-p. 6, in which the listed references were cited.

*Primary Examiner* — Hung V Ngo
(74) *Attorney, Agent, or Firm* — Jianq Chyun IP Office

(57) ABSTRACT

A structure for reducing electromagnetic interference is provided, which includes a circuit board, an expansion slot and an electrical conductor. The circuit board has an upper surface and a ground circuit. The expansion slot is disposed on the upper surface of the circuit board, and has at least one metal pin electrically connected to the circuit board. The electrical conductor is located above the upper surface of the circuit board, and a gap is maintained between the electrical conductor and the metal pin of the expansion slot to produce a capacitor. A method for reducing electromagnetic interference is further provided, for accomplishing the above-mentioned structure.

14 Claims, 9 Drawing Sheets

(51) Int. Cl.
  *H05K 1/02*   (2006.01)
  *H05K 7/14*   (2006.01)
  *H05K 1/18*   (2006.01)
  *H05K 3/30*   (2006.01)
  *H05K 1/14*   (2006.01)

(52) U.S. Cl.
  CPC .............. *H05K 3/30* (2013.01); *H05K 7/142* (2013.01); *H05K 9/0039* (2013.01); *H05K 1/0231* (2013.01); *H05K 1/141* (2013.01); *H05K 2201/10015* (2013.01); *H05K 2201/1031* (2013.01)

(56) References Cited

U.S. PATENT DOCUMENTS

| | | |
|---|---|---|
| 6,297,965 B1 | 10/2001 | Sasaki et al. |
| 6,337,798 B1 | 1/2002 | Hailey et al. |
| 6,580,028 B1 | 6/2003 | Mellberg et al. |
| 8,294,043 B2 * | 10/2012 | Munoz ............... H01R 13/6595 174/359 |
| 2010/0025010 A1 | 2/2010 | Cipolla et al. |
| 2013/0088829 A1 | 4/2013 | Co |
| 2013/0120926 A1 | 5/2013 | Barina et al. |

FOREIGN PATENT DOCUMENTS

| | | |
|---|---|---|
| TW | 201345406 | 11/2013 |
| TW | M493753 | 1/2015 |
| WO | 9936959 | 7/1999 |

* cited by examiner

STRUCTURE AND METHOD FOR REDUCING ELECTROMAGNETIC INTERFERENCE

CROSS-REFERENCE TO RELATED APPLICATION

This application claims the priority benefit of Taiwan application serial no. 104124686, filed on Jul. 30, 2015. The entirety of the above-mentioned patent application is hereby incorporated by reference herein and made a part of this specification.

BACKGROUND OF THE INVENTION

Field of the Invention

The invention relates to reduction of electromagnetic interference, and particularly relates to a structure and a method for reducing electromagnetic interference without using a metal shield.

Description of Related Art

When a connector and electronic parts connected thereto operate, transmission of a high frequency electronic signal thereof may radiate generated common mode noise into space to form electromagnetic interference (EMI). The EMI may interfere other devices and components, which may cause functional reduction of the interfered components. Therefore, electromagnetic compatibility regulations of various nations specify EMI intensity.

Conventionally, in order to decrease the EMI intensity, a grounded metal shield is adopted to shield and decrease the intensity of the common mode noise radiated into the space. Although the metal shield may effectively decrease the EMI intensity, it may occupy a certain configuration space in an electronic device.

Regarding a thin electronic device, since an internal space thereof is relatively small, it is not conducive to additional setting of excessive components. Moreover, setting of the metal shield is also not conducive to an air-cooling effect of a wrapped object. Therefore, a new solution has to be found to reduce the EMI, so as to resolve the above problem.

SUMMARY OF THE INVENTION

The invention provides a structure for reducing electromagnetic interference, which includes a circuit board, an expansion slot and an electrical conductor. The circuit board has an upper surface and a ground circuit. The expansion slot is disposed on the upper surface of the circuit board, and has at least one metal pin electrically connected to the circuit board. The electrical conductor is located above the upper surface of the circuit board, and a gap is maintained between the electrical conductor and the metal pin of the expansion slot to produce a capacitor.

In an embodiment of the invention, the expansion slot has a connection side and a substrate side opposite to each other, an opening of the expansion slot is located at the connection side, a pointing direction of the opening of the expansion slot is parallel to the circuit board, and the metal pin is disposed correspondingly to the substrate side.

In an embodiment of the invention, a gap is maintained between the electrical conductor and the upper surface of the circuit board to produce another capacitor between the electrical conductor and the ground circuit.

In an embodiment of the invention, the structure for reducing EMI further includes an insulator wrapping the electrical conductor.

In an embodiment of the invention, the structure for reducing EMI further includes an insulator disposed between the electrical conductor and the expansion slot and between the electrical conductor and the upper surface of the circuit board.

In an embodiment of the invention, a ground contact is further disposed on the circuit board, the ground contact is located on the upper surface of the circuit board and electrically connected to the ground circuit, and the electrical conductor contacts the ground contact.

In an embodiment of the invention, the structure for reducing EMI further includes a metal housing, the metal housing maintains a gap with the upper surface, and contacts the electrical conductor to produce electrical conduction.

In an embodiment of the invention, the structure for reducing EMI further includes an insulator disposed between the electrical conductor and the expansion slot.

The invention provides a method for reducing EMI, which includes following steps. A circuit board is configured, where the circuit board has an upper surface, and the circuit board is electrically connected to a ground circuit. An expansion slot having at least one metal pin is provided, the expansion slot is disposed on the upper surface of the circuit board, and the metal pin is electrically connected to the circuit board. An electrical conductor is provided, where the electrical conductor is disposed on the upper surface of the circuit board, and a gap is maintained between the electrical conductor and the metal pin of the expansion slot to produce a capacitor.

In an embodiment of the invention, the method for reducing EMI further includes maintaining a gap between the electrical conductor and the upper surface of the circuit board to produce another capacitor.

In an embodiment of the invention, the method for reducing EMI further includes providing an insulator to wrap the electrical conductor.

In an embodiment of the invention, the method for reducing EMI further includes providing an insulator disposed between the electrical conductor and the expansion slot and between the electrical conductor and the upper surface of the circuit board.

In an embodiment of the invention, the method for reducing EMI further includes providing a ground contact, where the ground contact is located on the upper surface of the circuit board and electrically connected to the ground circuit, and the electrical conductor contacts the ground contact.

In an embodiment of the invention, the method for reducing EMI further includes providing a metal housing, wherein the metal housing maintains a gap with the upper surface, and contacts the electrical conductor to produce electrical conduction.

In an embodiment of the invention, the method for reducing EMI further includes providing an insulator disposed between the electrical conductor and the substrate side of the expansion slot.

According to above description, by setting relative positions of the expansion card, the expansion slot and the circuit board, a closed electromagnetic loop with a short path is formed, such that an electromagnetic wave produced at the metal pin during operations of the expansion card and the expansion slot is converged to the closed electromagnetic loop with the short path without being spread to the space. The relative position setting method is adapted to notebook computers, thin computer hosts or other types of thin electronic devices with extreme height restrictions, where usage of an extra metal shield is unnecessary, which effectively simplifies an EMI shielding structure.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
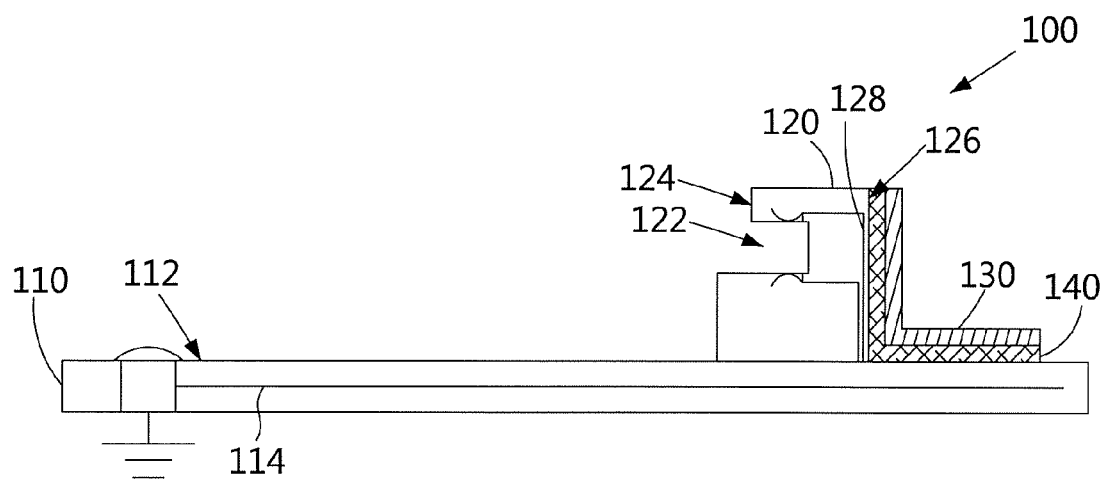
FIG. 1 is a side view of a structure 100 for reducing electromagnetic interference (EMI) according to a first embodiment of the invention.

Referring to FIG. 1, FIG. 1 is a side view of a structure 100 for reducing electromagnetic interference (EMI) according to a first embodiment of the invention. The structure 100 for reducing EMI includes a circuit board 110, an expansion slot 120 and an electrical conductor 130.

As shown in FIG. 1, the circuit board 110 can be (but not limited to) a motherboard of a desktop computer, a motherboard of a notebook computer, or any circuit board 110 having the expansion slot 120. The circuit board 110 has an upper surface 112 and a ground circuit 114. The ground circuit 114 is located at one of a plurality of copper circuit layers of the circuit board 110. Moreover, according to functional requirements, the circuit board 110 is further configured with other connection lines, connection ports, sockets, electronic chips, etc., which are well known by those skilled in the art, and since the above components are not novel features of the invention, details thereof are not repeated.

The expansion slot 120 is disposed on the upper surface 112 of the circuit board 110. In the embodiment of the invention, the expansion slot is, for example, memory card slot, though other expansion card slots can also be adopted. The expansion slot 120 has at least one metal pin 128 electrically connected to the circuit board 110.

In the first embodiment, the expansion slot 120 adopts a landscape configuration, i.e. a pointing direction of an opening 122 of the expansion slot 120 is parallel to the upper surface 112 of the circuit board 110. The expansion slot 120 has a connection side 124 and a substrate side 126 opposite to each other, and the opening 122 of the expansion slot 120 is located at the connection side 124. A memory card 200 also adopts the landscape configuration, and is inserted into the opening 122 to electrically connect the expansion slot 120. The metal pin 128 of the expansion slot 120 corresponds to the substrate side 126.

However, the expansion slot 120 is not limited to the landscape configuration, and may also adopt a portrait configuration, i.e. the substrate side 126 is disposed on the upper surface 112 of the circuit board 110, such that the opening 122 faces upward, and the metal pin 128 is disposed on a side of the expansion slot 120.

The electrical conductor 130 is located above the upper surface 112 of the circuit board 110, and the electrical conductor 130 and the metal pin 128 of the expansion slot 130 maintain a gap there between without direct electrical connection, so as to produce a capacitor C between the electrical conductor 130 and the metal pin 128. The electrical conductor 130 can be a metal or a conductive foam. Moreover, electrical conductor 130 and the upper surface 112 of the circuit board 110 also maintain a gap there between, so as to produce another capacitor C between the electrical conductor 130 and the ground circuit 114.

The electrical conductor 130 can be an L-shaped cross-section structure, where a part of the electrical conductor 130 corresponds to the substrate side 126 of the expansion slot 120, and the other part of the electrical conductor 130 corresponds to the ground circuit 114 of the circuit board 110.

Figure 2:
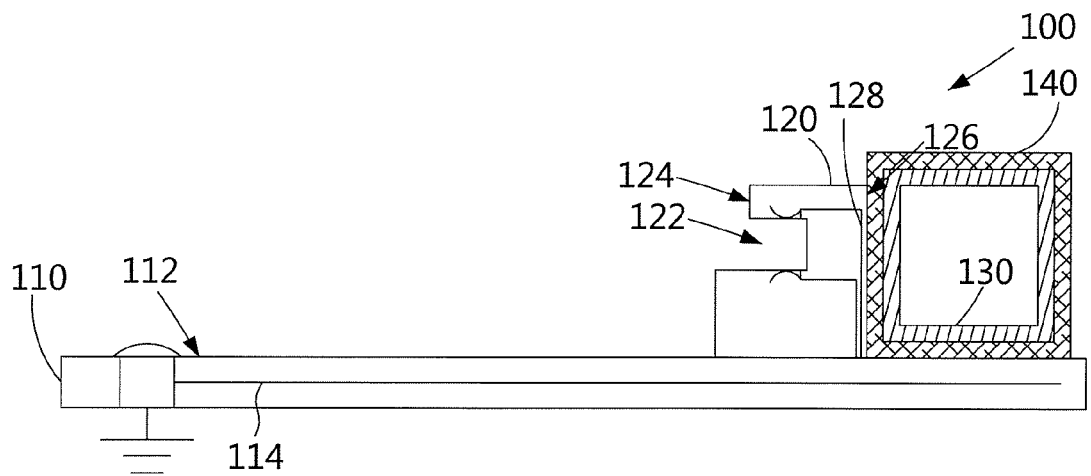
FIG. 2 is another side view of the first embodiment of the invention.

As shown in FIG. 2, the electrical conductor 130 can also be a metal or a conductive foam having a rectangle cross-section, where one side of the electrical conductor 130 corresponds to the substrate side 126 of the expansion slot 120, and another side of the electrical conductor 130 corresponds to the ground circuit 114 of the circuit board 110.

Figure 3:
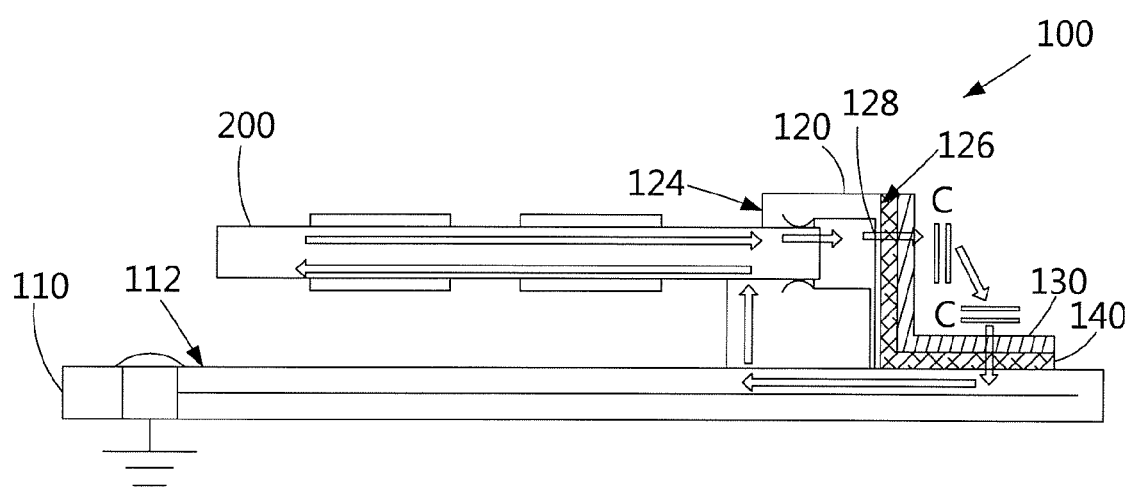
FIG. 3 is a side view of a closed electromagnetic loop according to the first embodiment of the invention.

As shown in FIG. 3, when an expansion card, for example, the memory card 200 is inserted into the expansion slot 120, both sides of the memory card 200, the metal pin 128 of the substrate side 126, the two sets of capacitors C and the ground circuit 114 of the circuit board 110 form a closed electromagnetic loop with a short path, such that an electromagnetic wave produced at the metal pin 128 during operations of the memory card 200 and the expansion slot 120 is converged to the closed electromagnetic loop with the short path without being spread to the space, by which the EMI is reduced without using an extra metal shield to shield the electromagnetic wave.

Figure 4:
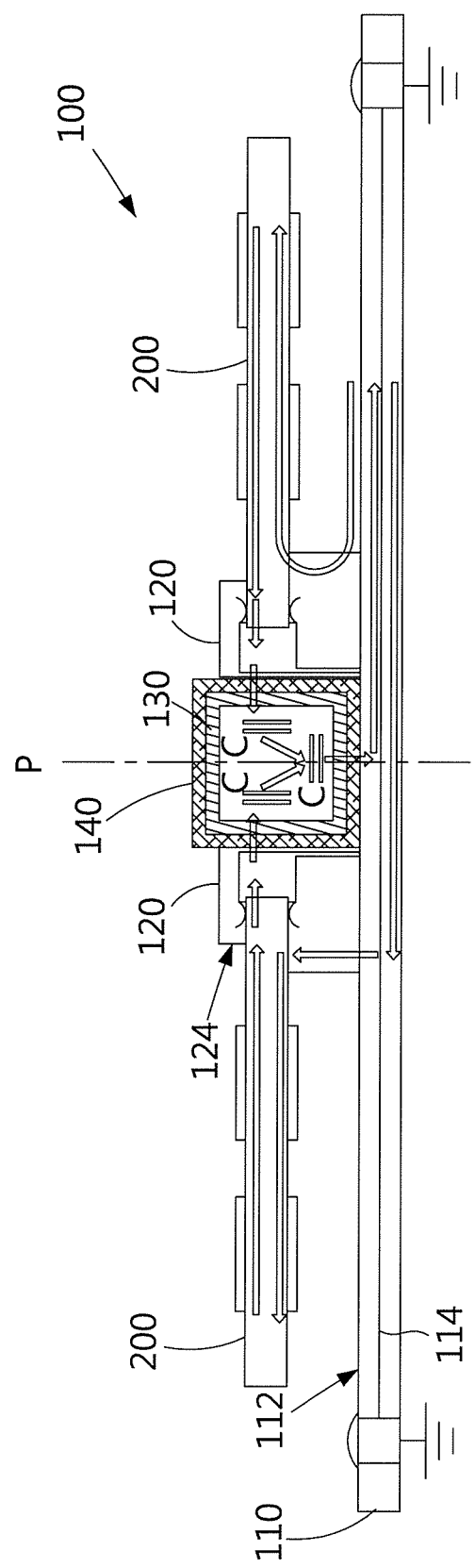
FIG. 4 is another side view of the first embodiment of the invention.

As shown in FIG. 4, in an embodiment, two expansion slots 120 can be adopted, where the two expansion slots 120 are symmetrically disposed along a centerline P, and commonly share the electrical conductor 130 and the ground circuit 114 to from two closed electromagnetic loops with short paths.

Figure 5:
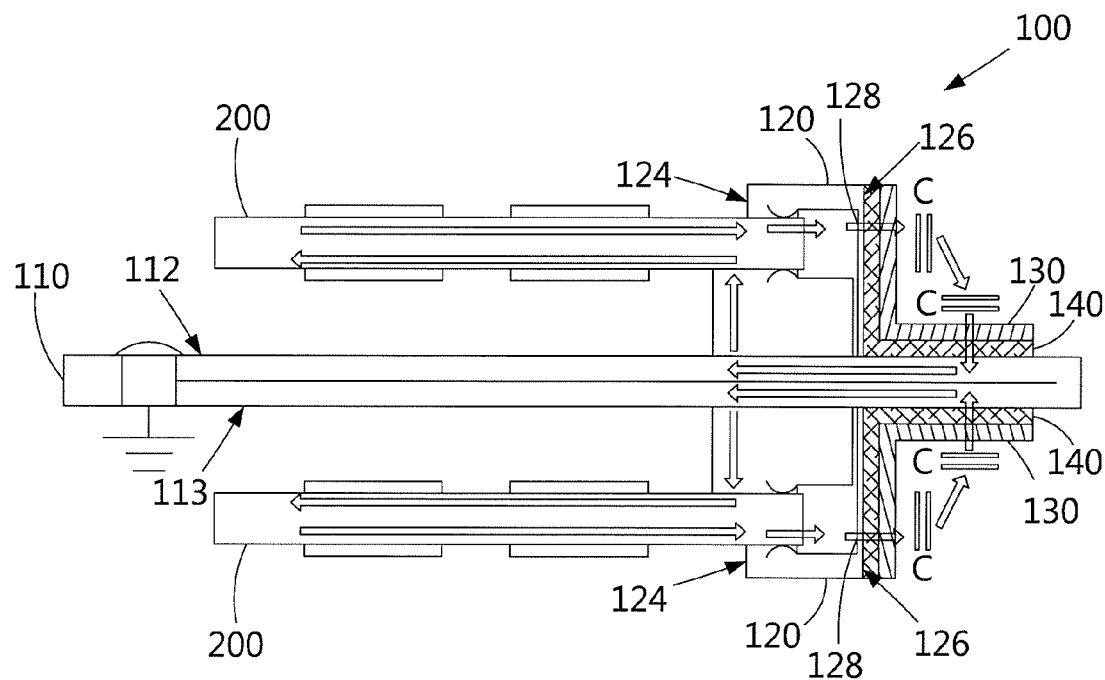
FIG. 5 is another side view of the first embodiment of the invention.

As shown in FIG. 5, in an embodiment, two expansion slots 120 can be adopted, where the two expansion slots 120 are symmetrically disposed on the upper surface 112 and a lower surface 113 of the circuit board 110. Meanwhile, another electrical conductor 130 is further configured on the lower surface 113, so as to form another closed electromagnetic loop with short path on the lower surface 113 of the circuit board 110.

As shown in FIGS. 1, 2, 3, 4, 5, the structure 100 for reducing EMI further includes an insulator 140 disposed between the electrical conductor 130 and the expansion slot 120 and between the electrical conductor 130 and the upper surface 112 of the circuit board 110 to sure formation of the capacitors C, and capacitances thereof are increased through a dielectric property.

As shown in FIGS. 1, 3, 5, the insulator 140 can be a pure plate, an adhesive, which is adhered between the electrical conductor 130 and the expansion slot 120 and between the electrical conductor 130 and the upper surface 112 of the circuit board 110 to fix the electrical conductor 130, and meanwhile achieve the effects of insulation and improving the capacitances. The insulator 140 may adopt a partial wrapping manner for configuring between the electrical conductor 130 and the expansion slot 120 and between the electrical conductor 130 and the upper surface 112 of the circuit board 110, so as to maintain the gap required for forming the capacitors C.

As shown in FIG. 2 and FIG. 4, in case that the electrical conductor 130 is a tube, the insulator 140 may completely or partially wrap the electrical conductor 130, such that the insulator 140 contact the expansion slot 120 and the circuit board 110 to maintain the gap required for forming the capacitors C.

In the invention, a material of the insulator 140 preferably has a higher dielectric constant, so as to increase the capacitances of the generated capacitors C, for example, polyethylene, polystyrene, organic silicone resin, silicone, polyaramide fiber paper, polyester film, polyimide film or heat-resistant insulating rubber, etc.

Figure 6:
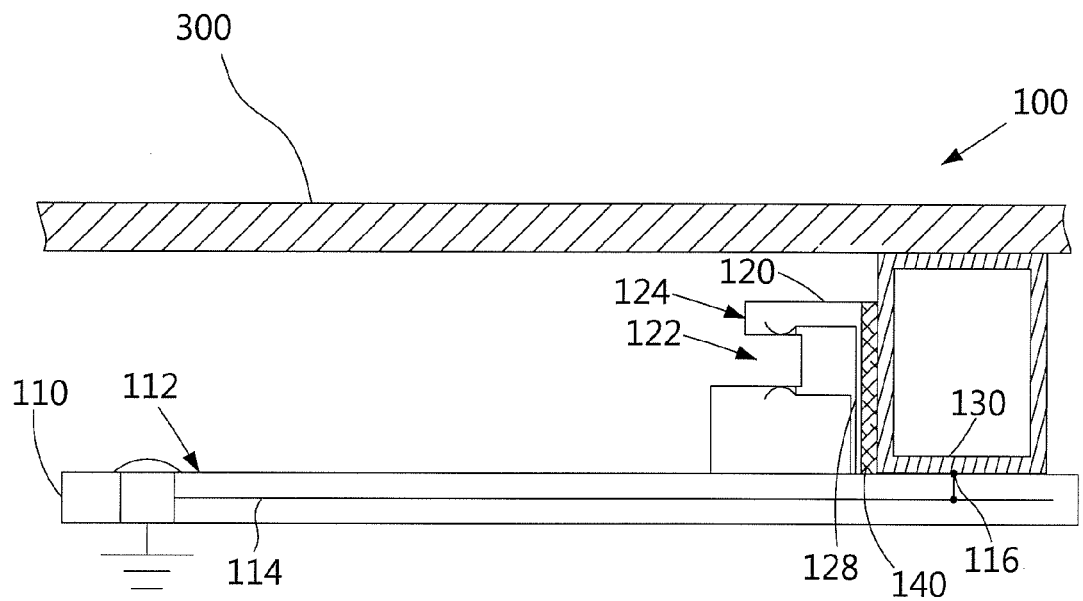
FIG. 6 is another side view of the first embodiment of the invention.

As shown in FIG. 6, in an electronic device using a metal housing 300, the metal housing 300 and the upper surface 112 maintain a gap there between. The metal housing 300 is connected to the ground (for example, electrically connected to the ground circuit 114). In this case, the metal housing 300 can be arranged to contact the electrical conductor 130, as shown in FIG. 6, at least a part of an upper end of the electrical conductor 130 is not wrapped by the insulator 140, such that the metal housing 300 contacts the electrical conductor 130 to produce electrical conductor. However, the electrical conductor 130 and the expansion slot 120 still maintain a gap there between, and the insulator 140 is disposed in the gap to produce the capacitor C between the electrical conductor 130 and the metal pin 128.

Moreover, allowed by a relative position between the circuit board 110 and the electrical conductor 130, the capacitor C between the electrical conductor 130 and the ground circuit 114 can be omitted, such that the electrical conductor 130 is directly connected to the ground, for example, at least a part of a lower end of the electrical conductor 130 is not covered by the insulator 140, and may contact a ground contact 116 for electrically connecting the ground circuit 114, such that the electrical conductor 130 is directly connected to the ground.

Figure 7:
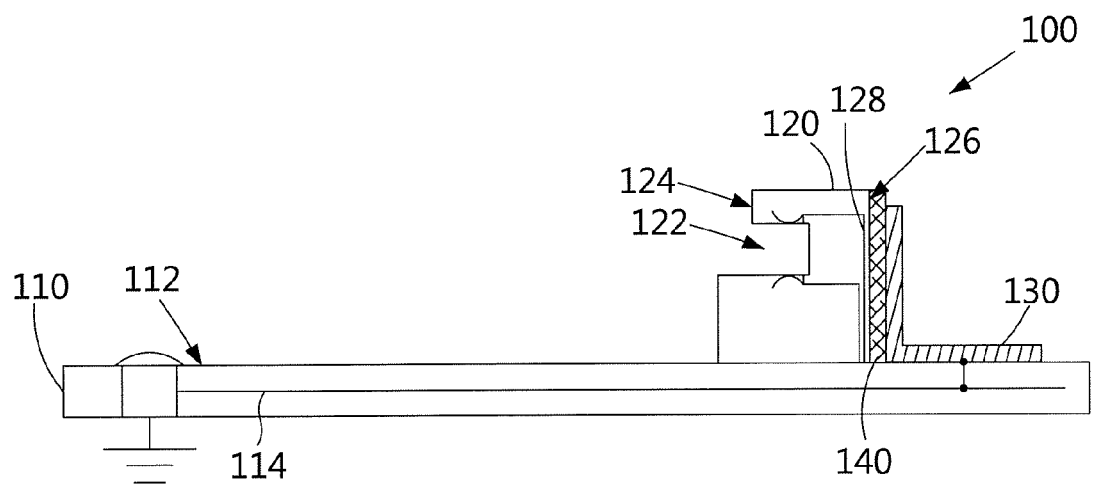
FIG. 7 is a side view of a structure 100 for reducing EMI according to a second embodiment of the invention.

As shown in FIG. 7, FIG. 7 is a structure 100 for reducing EMI according to a second embodiment of the invention. The structure 100 for reducing EMI includes the circuit board 110, the expansion slot 120, the electrical conductor 130 and the insulator 140.

In the second embodiment, the circuit board 110 is configured with the ground contact 116, which is located on the upper surface 112 of the circuit board 110 and electrically connected to the ground circuit 114, and the electrical conductor 130 contacts the ground contact 116. The insulator is disposed between the electrical conductor 130 and the substrate side 126 of the expansion slot 120, such that the electrical conductor 130 and the substrate side 126 of the expansion slot 120 maintain a gap there between to produce a capacitor C.

Figure 8:
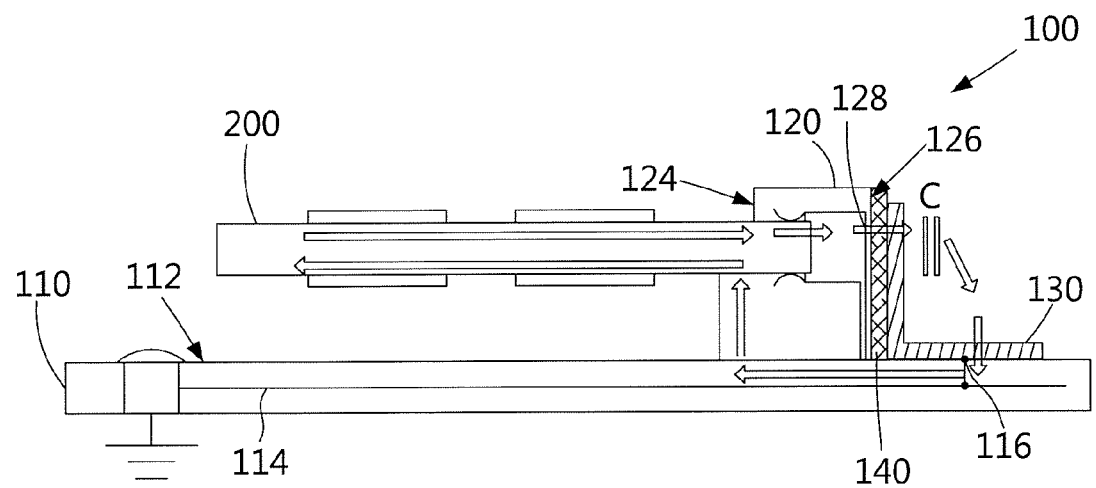
FIG. 8 is a side view of a closed electromagnetic loop according to the second embodiment of the invention.

As shown in FIG. 8, when the memory card 200 is inserted into the expansion slot 120, both sides of the memory card 200, the metal pin 128, the capacitor C and the ground circuit 114 of the circuit board 110 form a closed electromagnetic loop with a short path, such that an electromagnetic wave produced at the metal pin 128 during operations of the memory card 200 and the expansion slot 120 is converged to the closed electromagnetic loop with the short path without being spread to the space.

Figure 9:
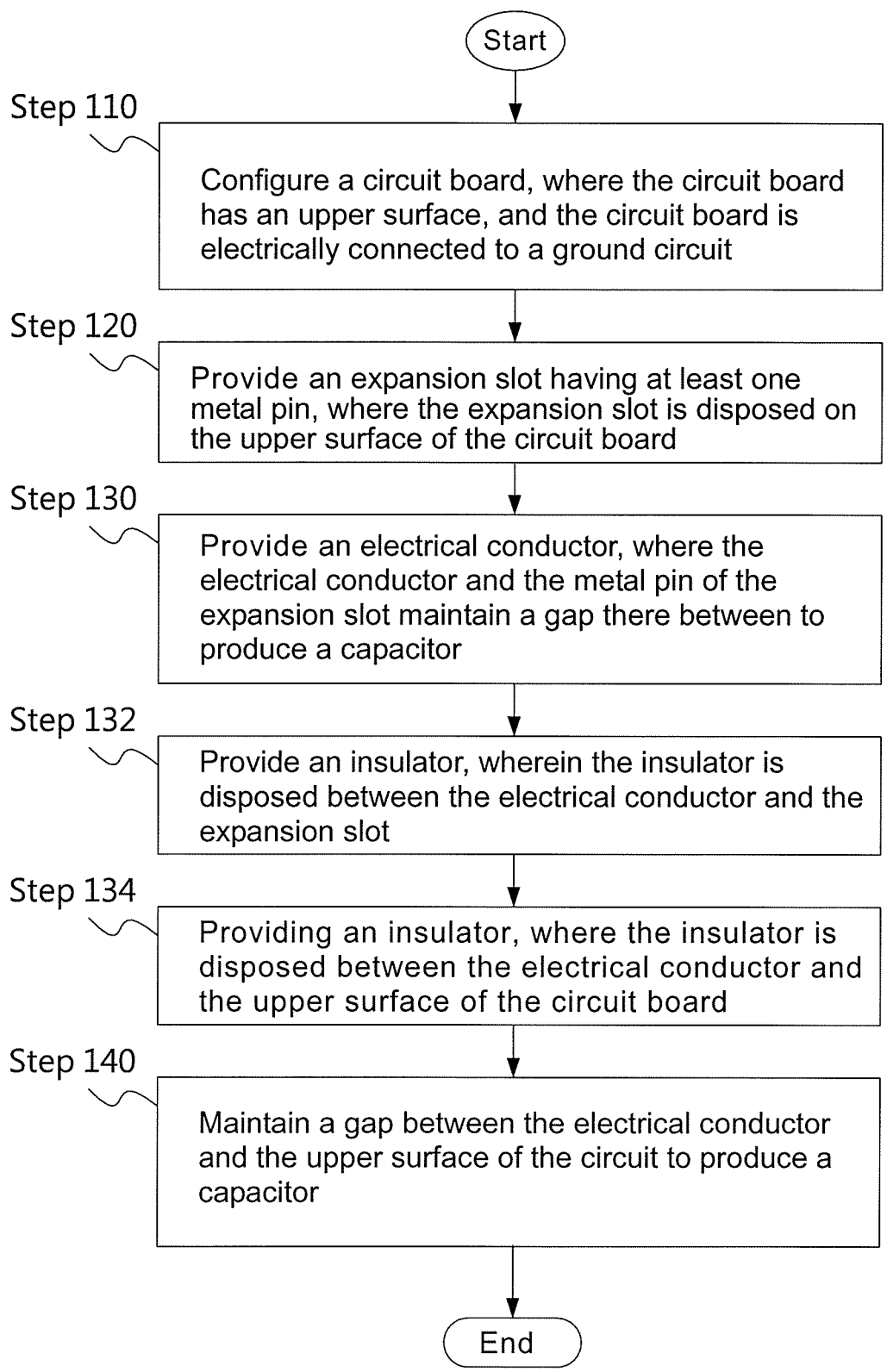
FIG. 9 is a flowchart illustrating a method for reducing EMI according to an embodiment of the invention.

Referring to FIG. 9, a method for reducing EMI is further provided in the invention, which is adapted to the aforementioned structure 100 for reducing EMI.

Figure 10:
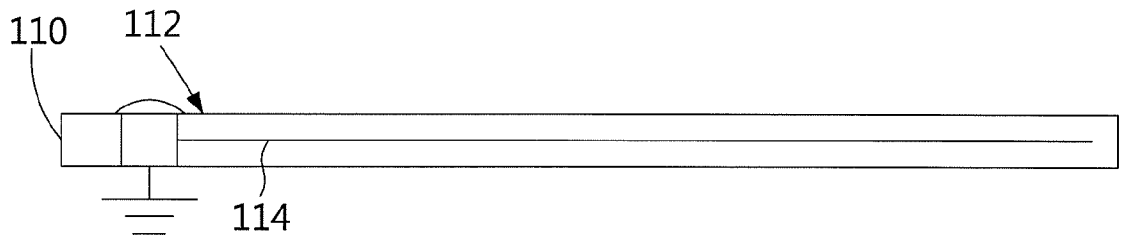
FIG. 10 to FIG. 12 are schematic diagrams of the method for reducing EMI according to an embodiment of the invention.

As shown in FIG. 9 and FIG. 10, according to the method, a circuit board 110 is first configured, where the circuit board 110 has an upper surface 112, and the circuit board 110 is electrically connected to a ground circuit 114, as shown by Step 110.

Figure 11:
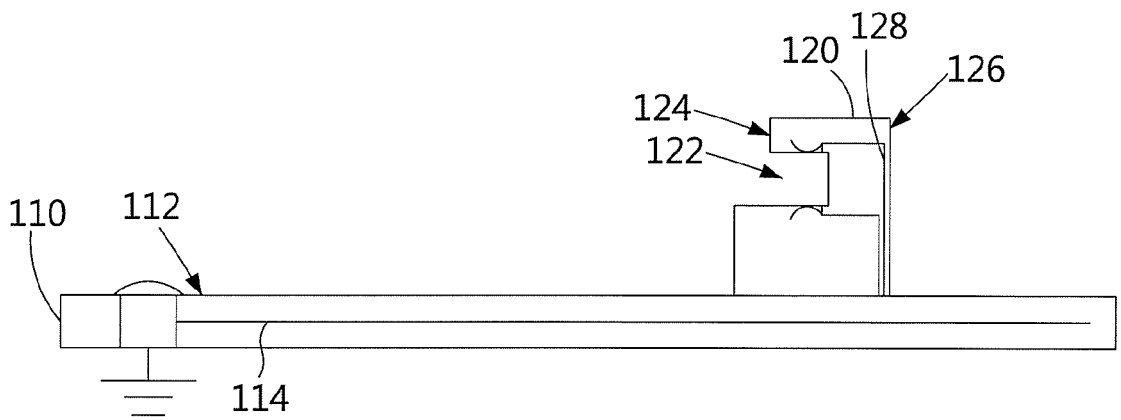

As shown in FIG. 9 and FIG. 11, an expansion slot 120 having at least one metal pin 128 is provided, where the expansion slot 120 is disposed on the upper surface 112 of the circuit board 110, as shown by Step 120. Meanwhile, the metal pin 128 is electrically connected to the circuit board 110.

Figure 12:
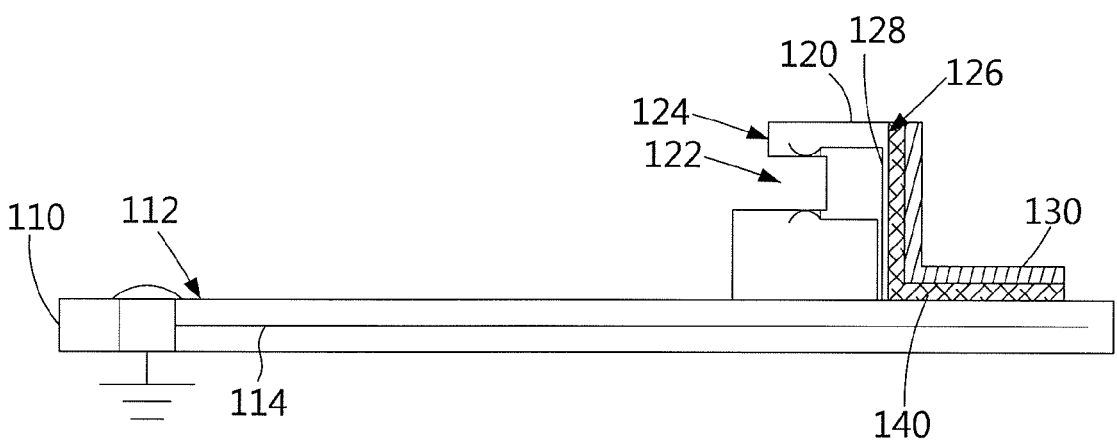

As shown in FIG. 9 and FIG. 12, an electrical conductor 130 is provided, which is disposed on the upper surface 112 of the circuit board 110, where the electrical conductor 130 and the metal pin 128 of the expansion slot 120 maintain a gap there between to produce a capacitor C, as shown by Step 130.

As shown in FIG. 9 and FIG. 12, after the Step 130, the method may further include a Step 140 of maintaining a gap between the electrical conductor 130 and the upper surface 112 of the circuit 110 to produce a capacitor C.

As shown in FIG. 9 and FIG. 12, before or after the step S130, the method further includes a Step 132 of providing an insulator 140, wherein the insulator is disposed between the electrical conductor 130 and the expansion slot 120, and another Step 134 of disposing the insulator 140 between the electrical conductor 130 and the upper surface 112 of the circuit board 110.

Figure 13:
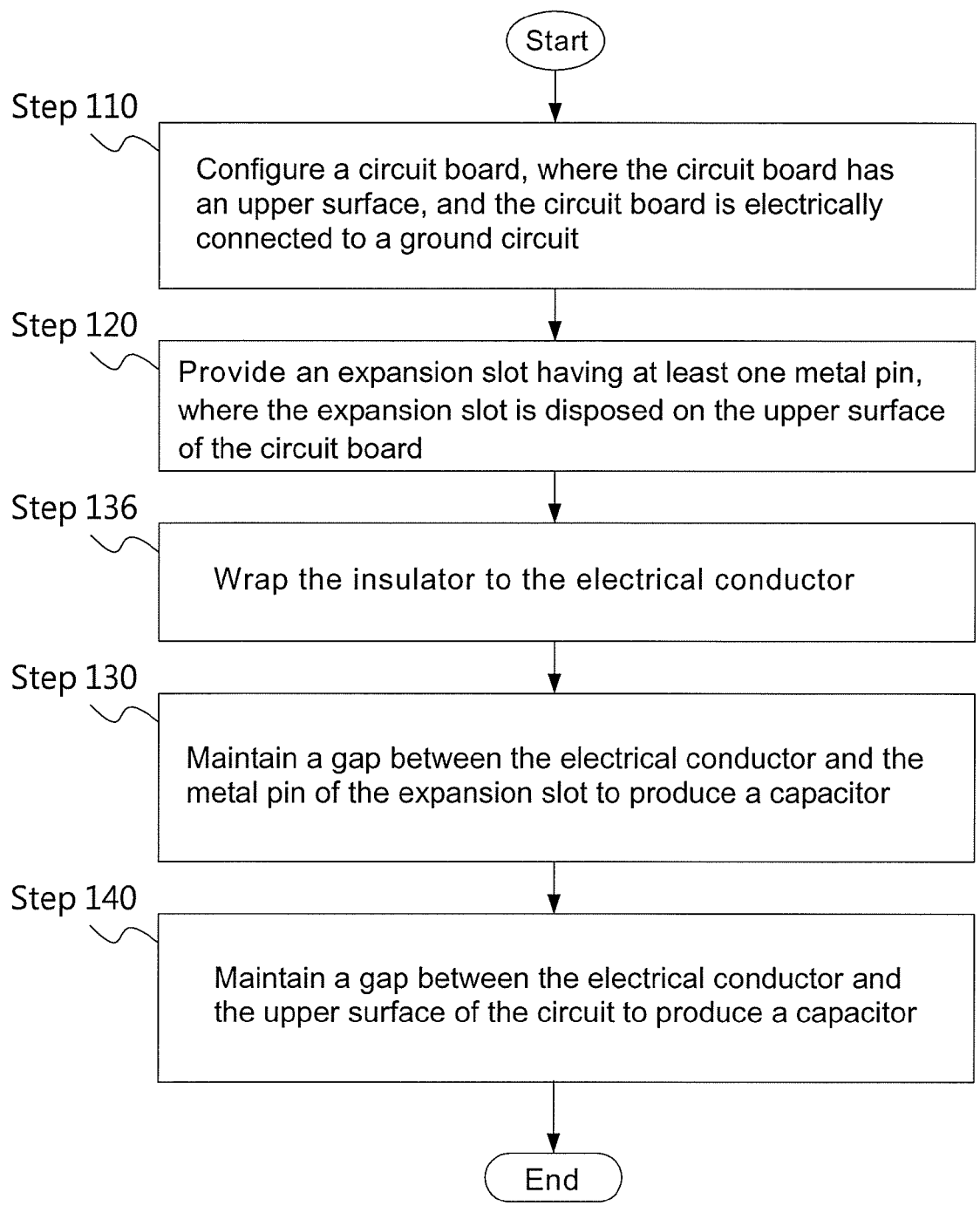
FIG. 13 is a flowchart illustrating a method for reducing EMI according to another embodiment of the invention.

As shown in FIG. 13, if the electrical conductor 130 is a metal tube with a rectangle cross-section, the Step 132 and Step 134 can be changed to wrap the insulator 140 on the electrical conductor 130 (Step 136).

Figure 14:
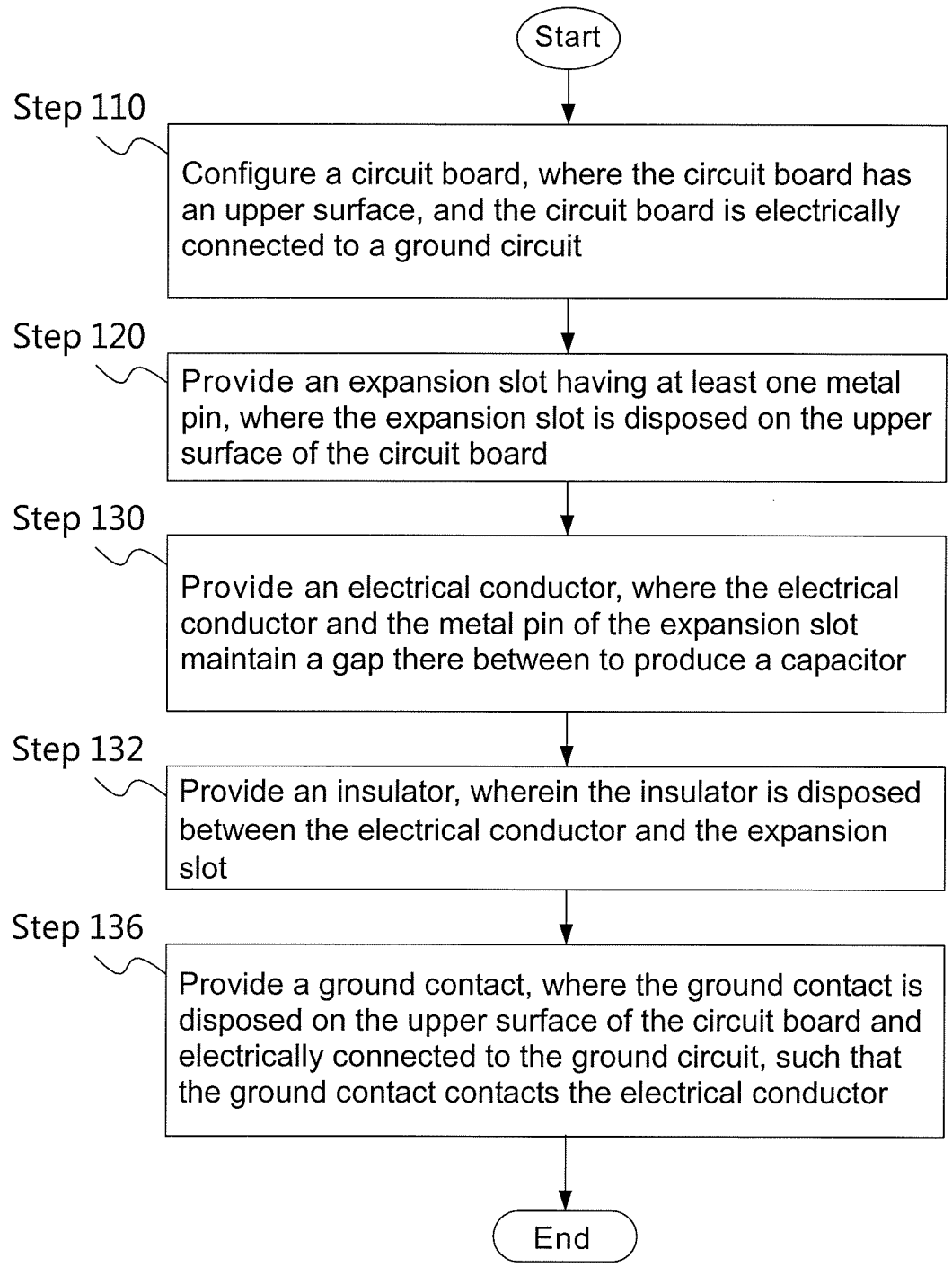
FIG. 14 is a flowchart illustrating a method for reducing EMI according to still another embodiment of the invention.

As shown in FIG. 14, if the circuit board 110 has an exposed ground contact 116, and a relative position thereof corresponds to the electrical conductor 130, the Step 134 can be modified to provide a ground contact 116, where the ground contact 116 is disposed on the upper surface 112 of the circuit board 110 and electrically connected to the ground circuit 114, such that the ground contact 116 contacts the electrical conductor 130, as shown in Step 138, and the Step 140 is deleted. Moreover, a metal housing 300 (serving as a housing of the electronic device, especially an upper part of the housing) is provided to maintain a gap with the upper surface 112, such that the metal housing 300 contacts the electrical conductor 130 to produce electrical conduction.

According to the above methods, assembling of the structure 100 for reducing EMI of the first embodiment or the second embodiment is completed.

In summary, by setting relative positions of the expansion card (the memory card 200), the expansion slot 120 and the circuit board 110, a closed electromagnetic loop with a short path is formed, such that an electromagnetic wave produced at the metal pin 128 during operations of the memory card 200 and the expansion slot 120 is converged to the closed electromagnetic loop with the short path without being spread to the space. The relative position setting method is adapted to notebook computers, thin computer hosts or other types of thin electronic devices with extreme height restrictions, where usage of an extra metal shield is unnecessary, which effectively simplifies an EMI shielding structure.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A structure for reducing electromagnetic interference, comprising:
    a circuit board, having an upper surface and a ground circuit;
    an expansion slot, disposed on the upper surface of the circuit board, and having at least one metal pin electrically connected to the circuit board; and
    an electrical conductor, located above the upper surface of the circuit board, wherein a gap is maintained between the electrical conductor and the metal pin of the expansion slot to produce a capacitor, and a gap is maintained between the electrical conductor and the upper surface of the circuit board to produce another capacitor between the electrical conductor and the ground circuit.

2. The structure for reducing electromagnetic interference as claimed in claim 1, wherein the expansion slot has a connection side and a substrate side opposite to each other, an opening of the expansion slot is located at the connection side, a pointing direction of the opening of the expansion slot is parallel to the circuit board, and the metal pin is disposed correspondingly to the substrate side.

3. The structure for reducing electromagnetic interference as claimed in claim 1, further comprising:
    an insulator, wrapping the electrical conductor.

4. The structure for reducing electromagnetic interference as claimed in claim 1, further comprising:
    an insulator, disposed between the electrical conductor and the expansion slot and between the electrical conductor and the upper surface of the circuit board.

5. The structure for reducing electromagnetic interference as claimed in claim 1, wherein a ground contact is further disposed on the circuit board, the ground contact is located on the upper surface of the circuit board and electrically connected to the ground circuit, and the electrical conductor contacts the ground contact.

6. The structure for reducing electromagnetic interference as claimed in claim 5, further comprising:
    a metal housing, maintaining a gap with the upper surface, and contacting the electrical conductor to produce electrical conduction.

7. The structure for reducing electromagnetic interference as claimed in claim 5, further comprising:
    an insulator, disposed between the electrical conductor and the expansion slot.

8. A method for reducing electromagnetic interference, comprising:
    configuring a circuit board, wherein the circuit board has an upper surface, and the circuit board is electrically connected to a ground circuit;
    providing an expansion slot having at least one metal pin, wherein the expansion slot is disposed on the upper surface of the circuit board, and the metal pin is electrically connected to the circuit board;
    providing an electrical conductor, wherein the electrical conductor is disposed on the upper surface of the circuit board, and a gap is maintained between the electrical conductor and the metal pin of the expansion slot to produce a capacitor; and
    maintaining a gap between the electrical conductor and the upper surface of the circuit board to produce a capacitor.

9. The method for reducing electromagnetic interference as claimed in claim 8, wherein the expansion slot has a connection side and a substrate side opposite to each other, an opening of the expansion slot is located at the connection side, a pointing direction of the opening of the expansion slot is parallel to the circuit board, and the metal pin is disposed correspondingly to the substrate side.

10. The method for reducing electromagnetic interference as claimed in claim 8, further comprising:
    providing an insulator to wrap the electrical conductor.

11. The method for reducing electromagnetic interference as claimed in claim 8, further comprising:
    providing an insulator, wherein the insulator is disposed between the electrical conductor and the expansion slot and between the electrical conductor and the upper surface of the circuit board.

12. The method for reducing electromagnetic interference as claimed in claim 8, further comprising:
    providing a ground contact, wherein the ground contact is disposed on the upper surface of the circuit board and electrically connected to the ground circuit, and the electrical conductor contacts the ground contact.

13. The method for reducing electromagnetic interference as claimed in claim 12, further comprising:
    providing a metal housing, wherein the metal housing maintains a gap with the upper surface, and contacts the electrical conductor to produce electrical conduction.

14. The method for reducing electromagnetic interference as claimed in claim 12, further comprising:
    providing an insulator, wherein the insulator is disposed between the electrical conductor and the expansion slot.

* * * * *